(12) United States Patent
Kanekawa et al.

(10) Patent No.: US 6,476,750 B1
(45) Date of Patent: Nov. 5, 2002

(54) OVER-SAMPLING A/D, D/A CONVERTER

(75) Inventors: Nobuyasu Kanekawa; Yasuyuki Kojima, both of Hitachi; Seigou Yukutake, Hitachinaka; Minehiro Nemoto, Hitachi; Kazuhisa Takami, Hitachi; Takayuki Iwasaki, Hitachi; Yusuke Takeuchi, Hachioji; Katsuhiro Furukawa, Ome, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/485,349

(22) PCT Filed: Jun. 11, 1999

(86) PCT No.: PCT/JP99/03131
§ 371 (c)(1),
(2), (4) Date: Feb. 9, 2000

(87) PCT Pub. No.: WO99/65147
PCT Pub. Date: Dec. 16, 1999

(30) Foreign Application Priority Data

Jun. 12, 1998 (JP) ............................................. 10-164694

(51) Int. Cl.$^7$ ................................................. H03M 1/12
(52) U.S. Cl. ........................ 341/155; 341/123; 341/61
(58) Field of Search ........................... 341/155, 61, 63, 341/123, 156, 122, 118, 144, 145; 708/313

(56) References Cited

U.S. PATENT DOCUMENTS

| 5,159,338 A | * | 10/1992 | Takahashi | 341/61 |
| 5,835,032 A | * | 11/1998 | Yashuda | 341/61 |
| 5,925,093 A | * | 7/1999 | Yasuda | 708/313 |
| 5,952,876 A | * | 9/1999 | Sakoda et al. | 327/551 |
| 6,147,632 A | * | 11/2000 | Iwasaki | 341/123 |

* cited by examiner

Primary Examiner—Brian Young
Assistant Examiner—John Nguyen
(74) Attorney, Agent, or Firm—Antonelli, Terry, Stout & Kraus, LLP

(57) ABSTRACT

The hardware of an over-sampling A/D and D/A converter is provided, which hardware is capable of being operated with either kind of software: one corresponding to a first method in which the over-sampling ratio is fixed and the other corresponding to a second method in which the over-sampling ratio is variable. The value N3 written on the pseudo-frequency-dividing-ratio-register 11 and the value N4 written on the pseudo-over-sampling-ratio-register 21 are converted through a user interface into the frequency dividing ratio N1 by the conversion circuit 12 and the converted result is written in the frequency-dividing-ratio-register 10.

22 Claims, 16 Drawing Sheets

OVER-SAMPLING A/D, D/A CONVERTER

TECHNICAL FIELD

The present invention relates to an over-sampling A/D (analog/digital) conversion apparatus and an over-sampling D/A (digital/analog) conversion apparatus, and in particular it relates to the setting function of a sampling frequency and an over-sampling rate.

BACKGROUND ART

There have been used an over-sampling A/D conversion technique and an over-sampling D/A conversion technique in which sampling is performed of a certain signal with a higher sampling frequency than a predetermined sampling frequency (Hereinafter the higher sampling frequency will be referred to as an over-sampling frequency for the purpose of discriminating it from the predetermined sampling frequency) to obtain the predetermined sampling frequency in thinning the sampled data by filtering in a digital manner.

According to the above technique, the quantization noise caused by a conversion error of an A/D or a D/A converter can be driven out to a higher frequency range, so that it is made possible to convert a signal at a higher degree of accuracy than that of the A/D or D/A converter to be used. In other words, the conversion accuracy requested to the A/D, or D/A converter for obtaining a predetermined conversion accuracy is lightened.

Further, according to the above-mentioned technique, the sampling is performed at a higher frequency than the predetermined sampling frequency, so that a Nyquist frequency, that is, an aliasing frequency at which aliasing is generated in a case of sampling becomes also high. Therefore, the characteristics requested to a prefilter for cutting-off frequencies higher than the Nyquist frequency at an A/D conversion is also lightened.

As mentioned in the above, in using A/D, D/A conversion technique by over-sampling, conversion accuracy can be upgraded and also the required characteristics for analog filters such as prefilters can be largely lightened.

In order to utilize the above mentioned A/D and D/A converters by conventional technique in various ways, sampling by various frequencies must be possible. In particular, in the case of a modem for performing data communications through telephone lines, where the communication speed has to be variable corresponding to the states of a communication line or to the kind of a protocol being supported by a person to communicate with, sampling by various frequencies must be possible. For that purpose, in many cases, operational parameters such as the sampling frequencies are arranged to be set at variable frequencies. There have been two setting methods as a related art in classifying roughly: a first method as shown in FIG. 11 in which the over-sampling frequency is variable and the over-sampling ratio is fixed (bibliographies: "UCB1100 Data Sheet", Phillips, "TLC320AD50C Data Manual", Texas Instrument, etc.), and a second method as shown in FIG. 13 in which both over-sampling frequency and over-sampling ratio are variable (bibliographies: "STLC7550 Data sheet", SGS-Thomson, etc.).

DISCLOSURE OF INVENTION

In the first method, the ratio of the over-sampling frequency to the sampling frequency is constant. Therefore, utilizing the characteristics of a digital filter whose frequency characteristic is scaled by an operating frequency, if a decimator is operated at an over-sampling frequency, the frequency characteristic of the decimator which attenuates the frequencies by higher than ½ of the sampling frequency can be realized with a digital filter having a set of filtering coefficients.

On the other hand, according to the second method, since the over-sampling ratio is variable, it is possible to select an over-sampling frequency having the best characteristics concerning an arbitrary sampling frequency and to bring out an optimum characteristic. However, in this method, the ratio of the over-sampling frequency to the sampling frequency is not constant, so that it is not possible to utilize the frequency characteristic of a digital filter which is scaled by an operating frequency, and the coefficients of digital filters have to be designed for every sampling ratio, the filters which compose a decimator.

In these methods, the numbers of operating parameters to be set are different from each other, so that the configurations of registers for setting the operating parameters are naturally different as shown in FIGS. 12, 14 and 16. Therefore, it is not possible to make a system of hardware operate in controlling correctly using the software developed for another system of hardware. Therefore, it has been impossible to use a system of hardware in place of another system of hardware.

In consideration of the above circumstances, the object of the present invention is to offer the hardware to be used for an over-sampling A/D or D/A converter which can be operated with the software developed for either system of hardware. When the object of the present invention is achieved, it is made possible to realize a system of hardware which is able to replace the hardware developed for either method, which will lead to the cost down of the hardware by mass production.

In order to solve the problem in the conventional technique, following means are taken in the present invention.

(1) The case where hardware has a configuration in which an over-sampling ratio is constant:

(a) In the case where hardware is operated with software based on the first method in which the over-sampling ratio is constant, a frequency dividing ratio is changed to a frequency dividing ratio and an over-sampling ratio, and the original oscillation frequency is divided based on the changed frequency dividing ratio and the over-sampling ratio, and a decimator is set at the changed over-sampling ratio.

(b) In the case where hardware is operated with software based on the second method in which the over-sampling ratio is variable, the original oscillation frequency is divided based on the frequency dividing ratio and the over-sampling ratio written or a register by the software, and the decimator is set at the written over-sampling ratio.

(2) The case where the hardware has a configuration in which over-sampling ratio is variable:

(a) In the case where hardware is operated with the software based on the first method in which the over-sampling ratio is constant, a frequency dividing ratio is changed to a frequency dividing ratio and an over-sampling ratio, and the original oscillation frequency is divided based on the changed frequency dividing ratio and the over-sampling ratio, and a decimeter is set at the changed over-sampling ratio.

(b) In the case where hardware is operated with the software based on the second method in which the over-sampling ratio is variable, the original oscillation frequency is divided based on the frequency dividing ratio and the over-sampling ratio written on a register by the software, and the decimeter is set at the written over-sampling ratio.

In short, by converting the parameters in a register, it is made possible to make the hardware in which the over-sampling ratio is fixed be operated with either of the software corresponding to the first method in which the over-sampling ratio is fixed or corresponding to the second method in which the over-sampling ratio is variable.

BEST MODE FOR CARRYING OUT THE INVENTION

In the following, the explanation about the embodiments according to the present invention will be given.

Figure 1:
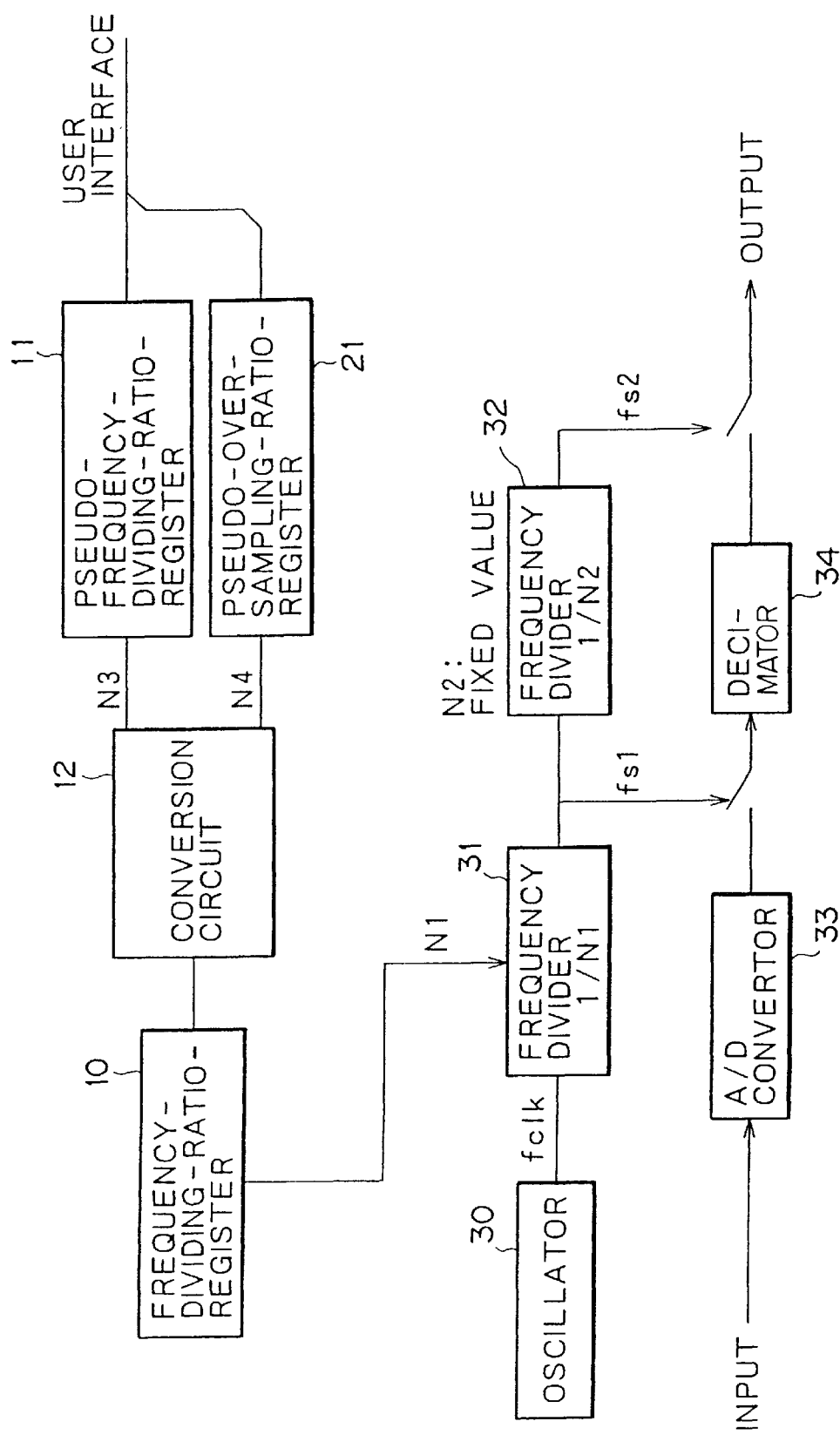
FIG. 1 shows a block diagram showing the configuration capable of being operated with the software in which the over-sampling ratio is variable.

FIG. 1 shows a basic embodiment according to the present invention. The embodiment is an example in which the hardware of a fixed over-sampling ratio is operated with the software corresponding to the second method of a variable over-sampling ratio.

A value N3 written on a pseudo-frequency-dividing-ratio-register 11 through a user interface and a value N4 written on a pseudo-over-sampling-ratio-register 21 are converted to a frequency dividing ratio N1 in the conversion circuit 12 and it is written on a frequency-dividing-ratio-register 10.

Where, there is a relation as shown below among N1, N2, N3 and N4.

$$N1=N3*N4/N2$$

Therefore, in order to generate N1 in converting N3 and N4, there are two ways: one is to execute the operation shown in the above expression, and the other is to convert from N3, N4 to N1 using a conversion table. The conversion method using a conversion table is effective for reducing the circuit scale, in particular when the number of setting combinations of N3 and N4 is limited.

The original oscillation frequency fclk generated in an oscillator 30 is frequency-divided to 1/N1 by a frequency divider 31, and it becomes an over-sampling frequency fs1. It is further frequency-divided to 1/N2 by a frequency divider 32 and becomes a sampling frequency fs2.

An A/D converter 33 samples an input analog signal with an over-sampling frequency fs1, and converts the signal to a digital signal. In the decimator 34, a thinning operation is performed on the sampled input signal using the sampling frequency fs1 to change the frequency of the signal to 1/N2, and the sampled signal is converted to a sampling frequency fs2. In the thinning operation, to change the sampled input signal frequency to 1/N2, in order to prevent the generation of aliasing, the decimator 34 has characteristics to sufficiently attenuate the frequency components higher than fs2/2. Such characteristics are often realized by a combination of digital type comb filters and low-pass filters. In many cases, the thinning to produce the frequency 1/N2 is not performed at one time, but is performed over a plurality of stages. In this case, the product of thinning rates for the respective stages becomes N2.

Figure 2:
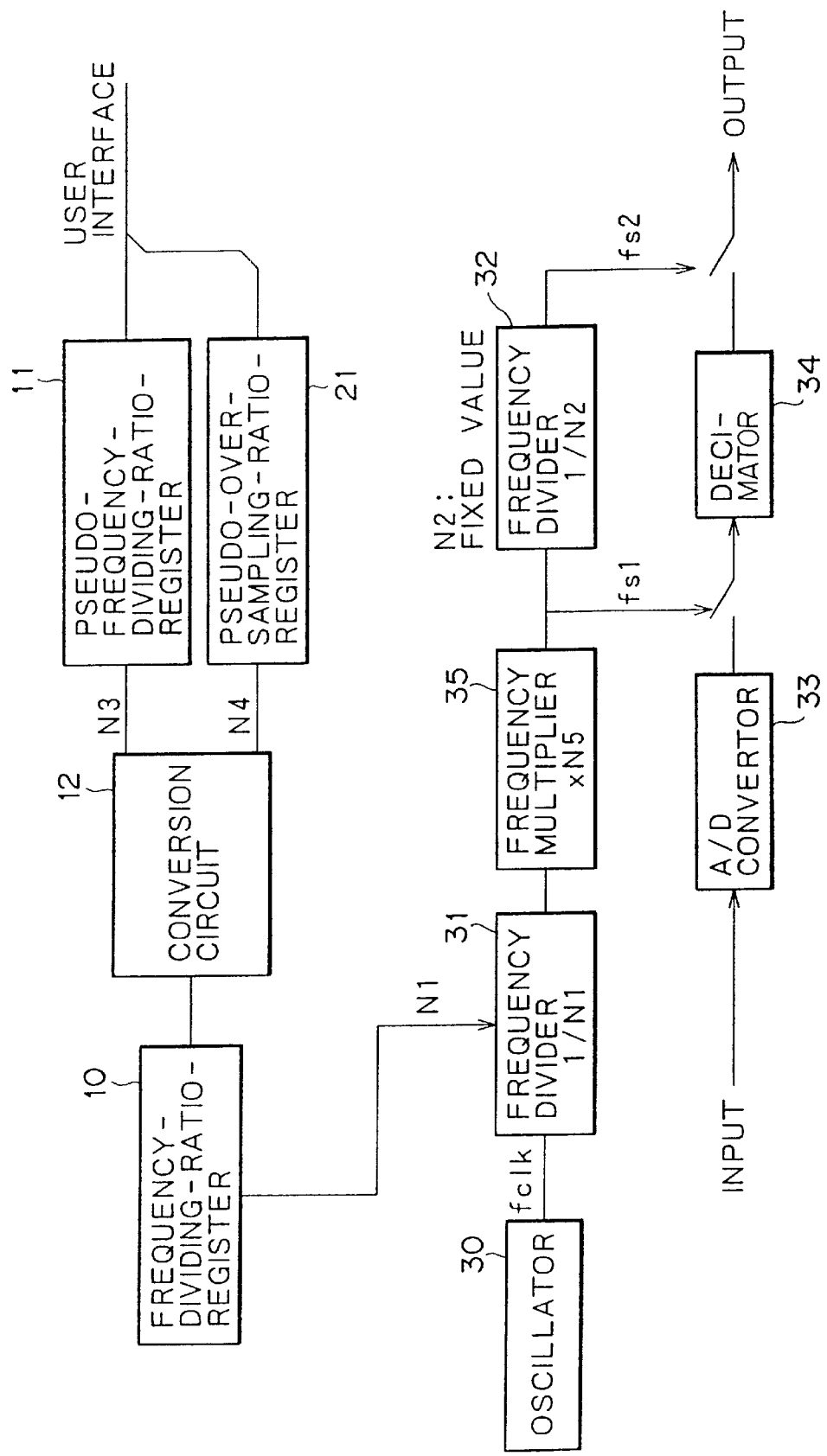
FIG. 2 shows a block diagram showing the configuration capable of being operated with both kinds of software in which the over-sampling ratio is variable or fixed.

In the embodiment shown in FIG. 1, in order to be able to set a plurality of sampling frequencies, the value of N1 must be large. Therefore, the original oscillation frequency fclk, an output of the oscillator 30, that is, N1×N2×fs2 becomes a high value. Therefore, a frequency multiplier 35 as shown in FIG. 2 is added to multiply the frequency to N5 times, which makes it possible to control the original oscillation frequency fclk, an output of the oscillator 30, to be as low as 1/N5. Owing to the above, the cost of the oscillator 30 can be controlled low. A PLL (Phase Locked Loop) is widely used for the frequency multiplier 35.

Among the N1, N2, N3, N4 and N5, following relation exists as shown by an expression shown below.

$$N1=N3*N4*N5/N2$$

Figure 3:
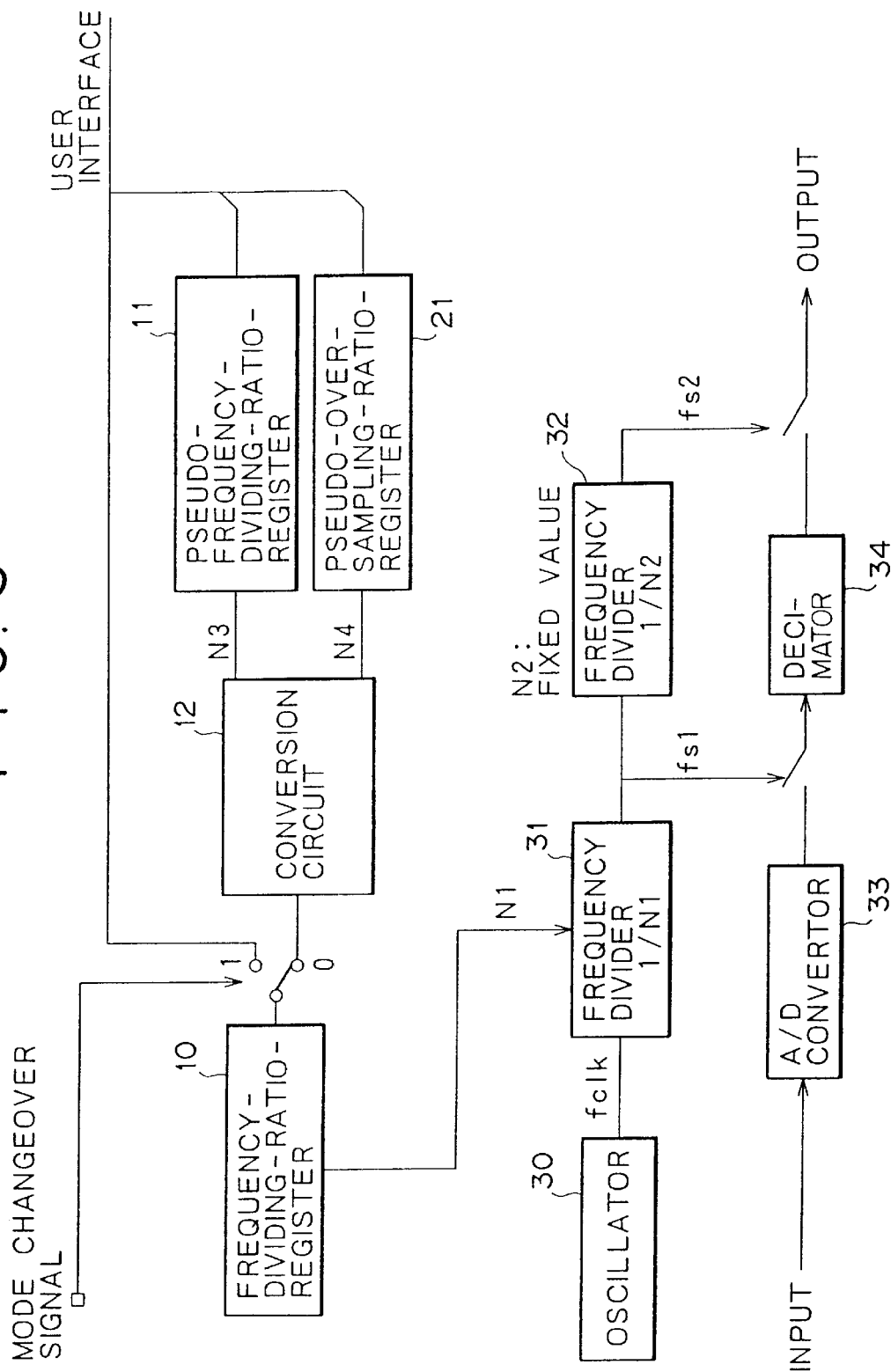
FIG. 3 shows a block diagram showing the configuration to which a mode changeover function is added.

FIG. 3 shows an embodiment in which the hardware in which sampling ratio is fixed is operated with both kinds of software: one corresponding to the first method in which an over-sampling ratio is fixed, and the other corresponding to the second method in which an over-sampling ratio is variable.

In the present embodiment, it is arranged in such a manner that the hardware can be operated with either kind of software in changing over the circuit by a mode changeover signal. At first, in a case where the software corresponds to the first method in which the over-sampling ratio is fixed, the mode changeover signal selects 1 and the value input through a user interface is written as it is on a frequency-dividing-ratio-register 10. In a case where the software corresponds to the second method in which the over-sampling ratio is variable, the mode changeover signal selects 0, and the value N3 written on a pseudo-frequency-dividing-ratio-register 11 and the value N4 written on a pseudo-over-sampling-ratio-register 21 through the user interface are converted to the frequency dividing ratio N1 in a conversion circuit 12, and it is written on the frequency-dividing-ratio-resister 10. In this embodiment, the mode changeover signal is assumed to be input from an external circuit as an independent signal, and in a case where the A/D converter is incorporated in a LSI, the LSI will be provided with a pin for inputting the mode changeover signal.

Figure 4:
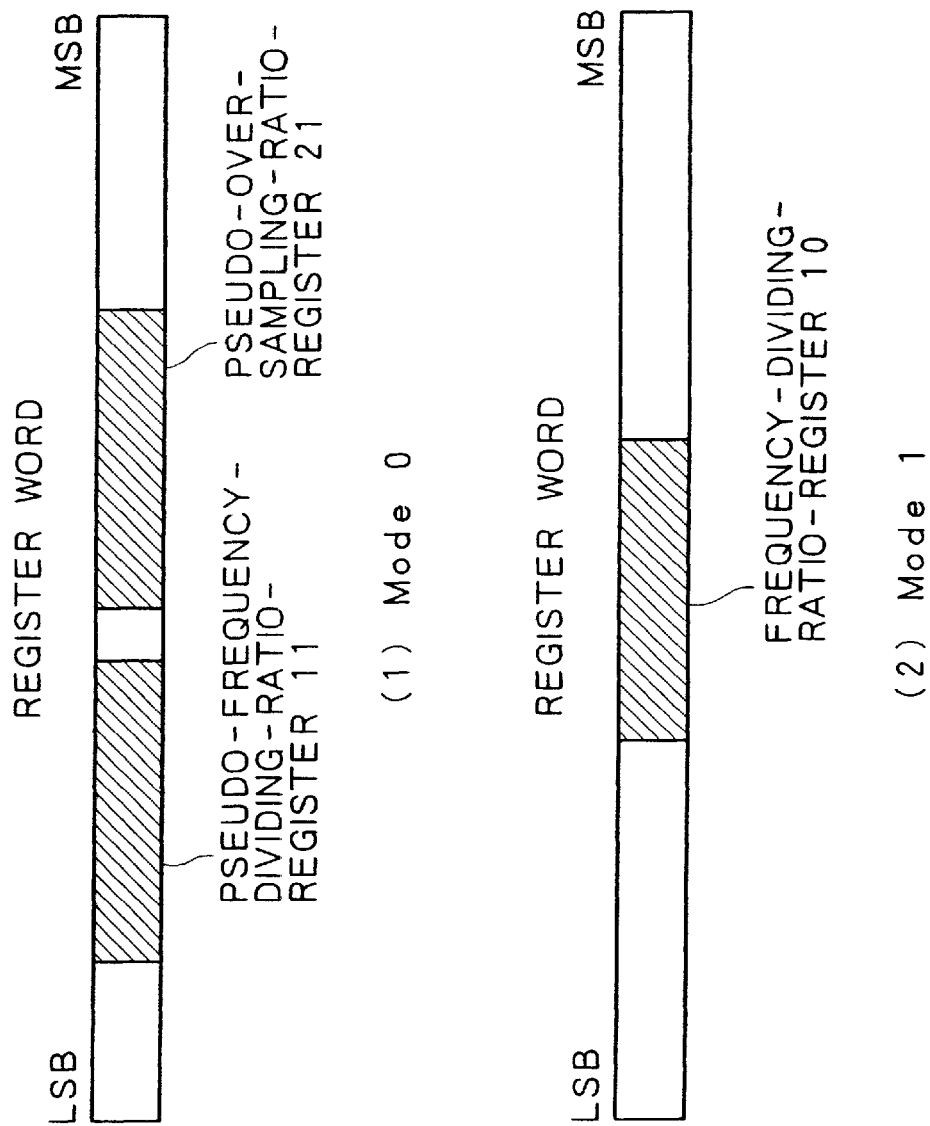
FIG. 4 shows the configuration of the register shown in FIG. 3.

FIG. 4 shows the configuration of a register in the embodiment shown in FIG. 3. In the present embodiment, the pseudo-frequency-dividing-ratio-register 11 and the pseudo-over-sampling-ratio-register 21 or the frequency-dividing-ratio-register 10 are allotted to a part of bits of a register word.

When the mode changeover signal is 0, that is, in a mode 0, the pseudo-frequency-dividing-ratio-register 11 and the pseudo-over-sampling-ratio-register 21 are allotted to a part of bits in a register word as shown in FIG. 4(1). In this mode, it is possible to set the operation of hardware according to a register writing format of the software corresponding to the second method in which the over-sampling ratio is variable.

When the mode changeover signal is 1, that is, in a mode 1, only the frequency-dividing-ratio-register 10 is allotted to a part of bits of a register word as shown in FIG. 4(2). In this mode, it is possible to set the operation of the hardware according to a register writing format of the software corresponding to the first method in which the over-sampling ratio is fixed.

Figure 5:
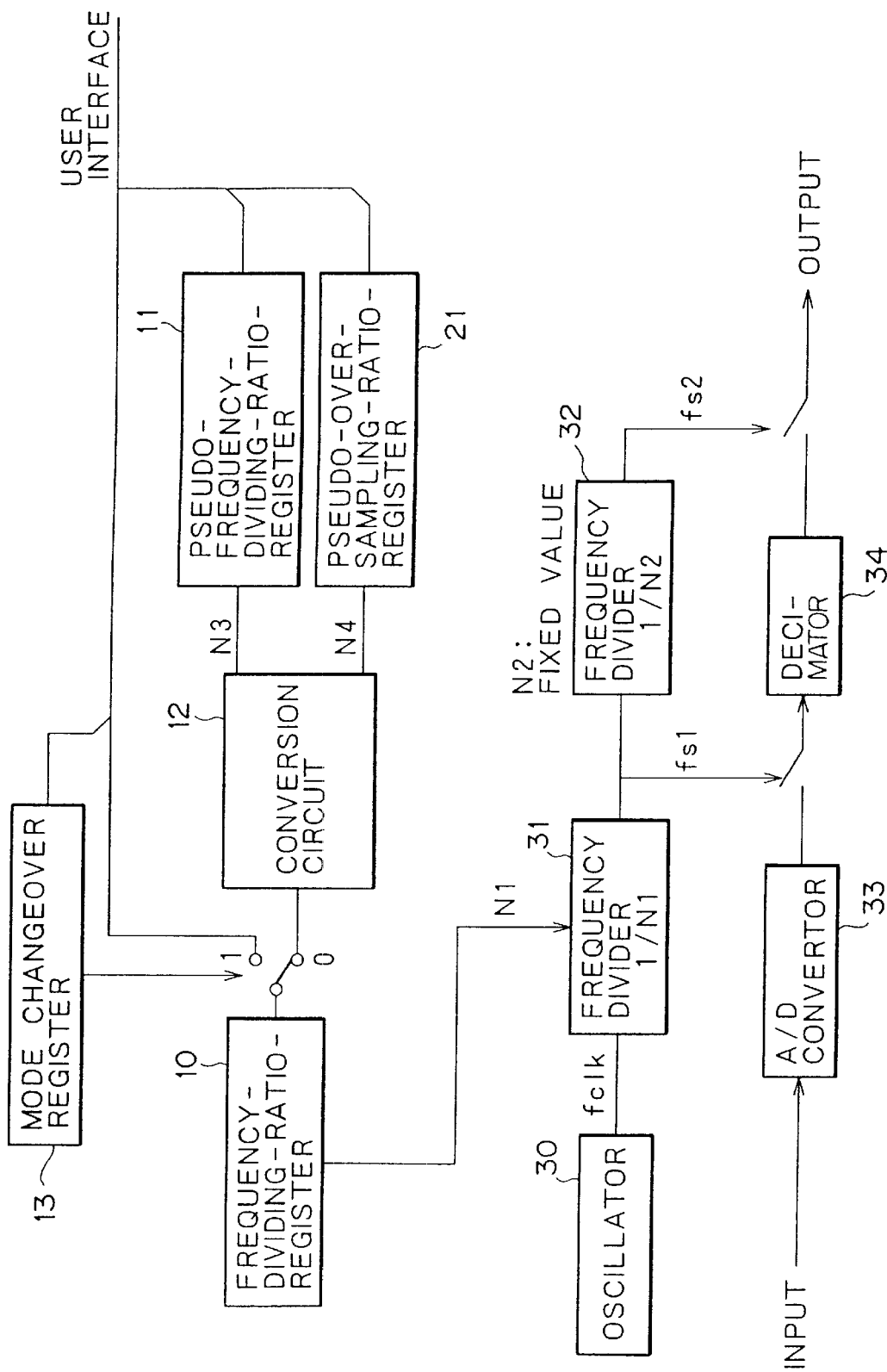
FIG. 5 shows a block diagram showing the configuration in which a mode changeover register is provided.

FIG. 5 shows an embodiment in which the mode changeover signal shown in FIG. 3 is given as a set value of a mode changeover register 13 through the user interface.

In the present embodiment, in the same manner as in the embodiment shown in FIG. 3, the hardware is capable of being operated with either kind of the software in switching the circuit according to the set value of the mode changeover register 13. In the case where the software corresponds to the first method in which over-sampling ratio is fixed the set value of the mode changeover register 13 is made 1 and the value input through the user interface is as it is written on the frequency-dividing-ratio-register 10. In the case where the software corresponds to the second method in which the over-sampling ratio is variable, the set value of the mode changeover register 13 is made 0, and the value N3 written on the pseudo-frequency-dividing-ratio-register 11 and the value N4 written on the pseudo-over-sampling-ratio-register 21 are converted to the frequency dividing ratio N1 by the conversion circuit 12, and it is written on the frequency-dividing-ratio-register 10.

Figure 6:
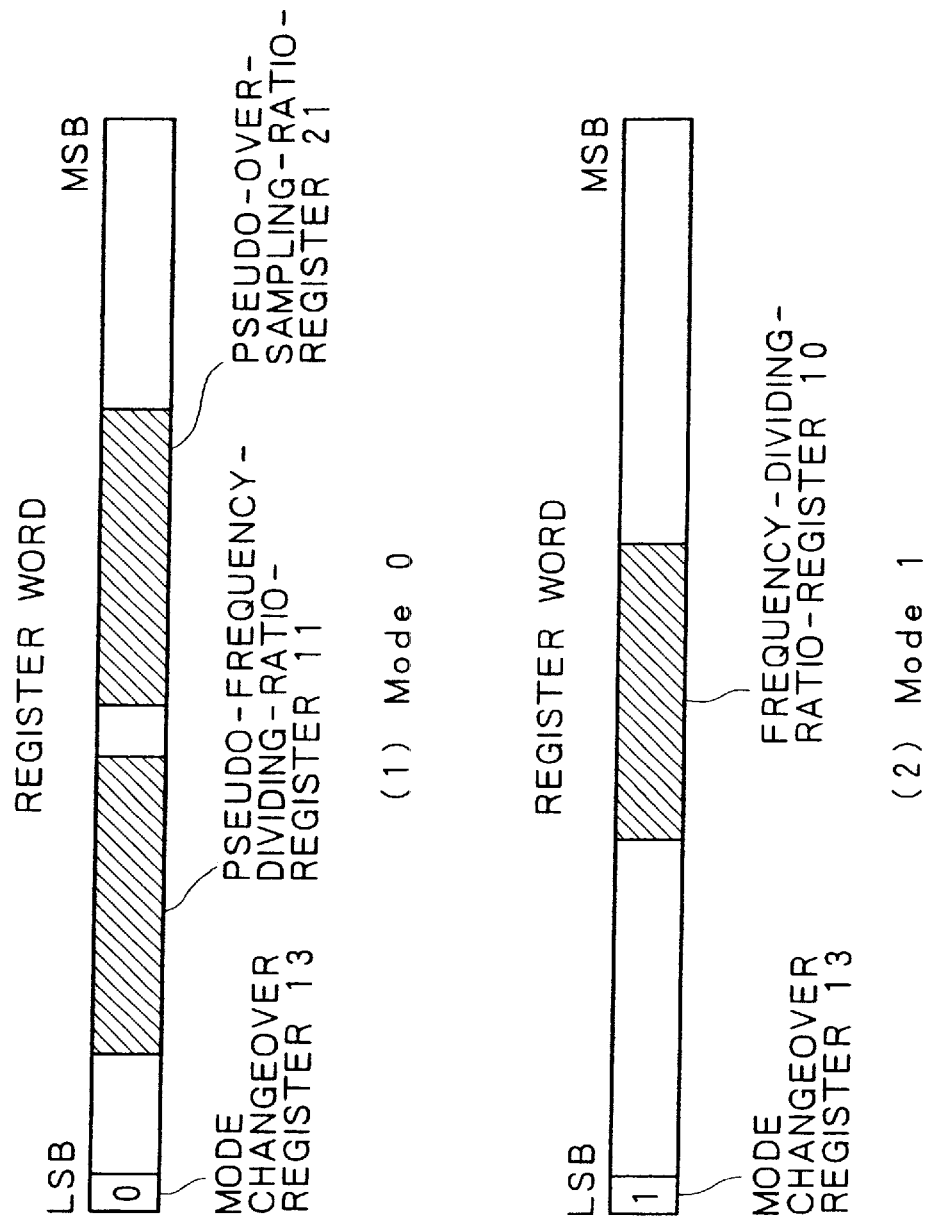
FIG. 6 shows the configuration of the register shown in FIG. 5.

FIG. 6 shows the configuration of the register in the embodiment shown in FIG. 4. The mode changeover register 13 is allotted to the LSB (Least Significant Bit); however naturally, it can be allotted to any bit. It might be better to decide the allotment of the mode changeover register 13 in consideration of the compatibility and conformity with the conventional method. In most cases, in both methods, the first and the second methods, some bits in a part of a register word are reserved for the future development, and some of the reserved bits will be used for the changeover register 13.

When the set value of the changeover register 13 is 0, that is, in the mode 0, the pseudo-frequency-dividing-ratio-register 11 and the pseudo-over-sampling-ratio-register 21 shown in FIG. 6(1) are allotted to the bits in a part of a register word. In this mode, it is possible to set the operation of hardware according to the register writing format of the software corresponding to the second method in which the over-sampling ration is variable.

When the set value of the changeover register 13 is 1, that is, in the mode 1, only the frequency-dividing-ratio-register 10 is allotted to the bits in a part of a register word as shown in FIG. 6(2). In this mode, it is possible to set the operation of hardware according to the register writing format of the software corresponding to the first method in which the over-sampling ratio is fixed.

Figure 7:
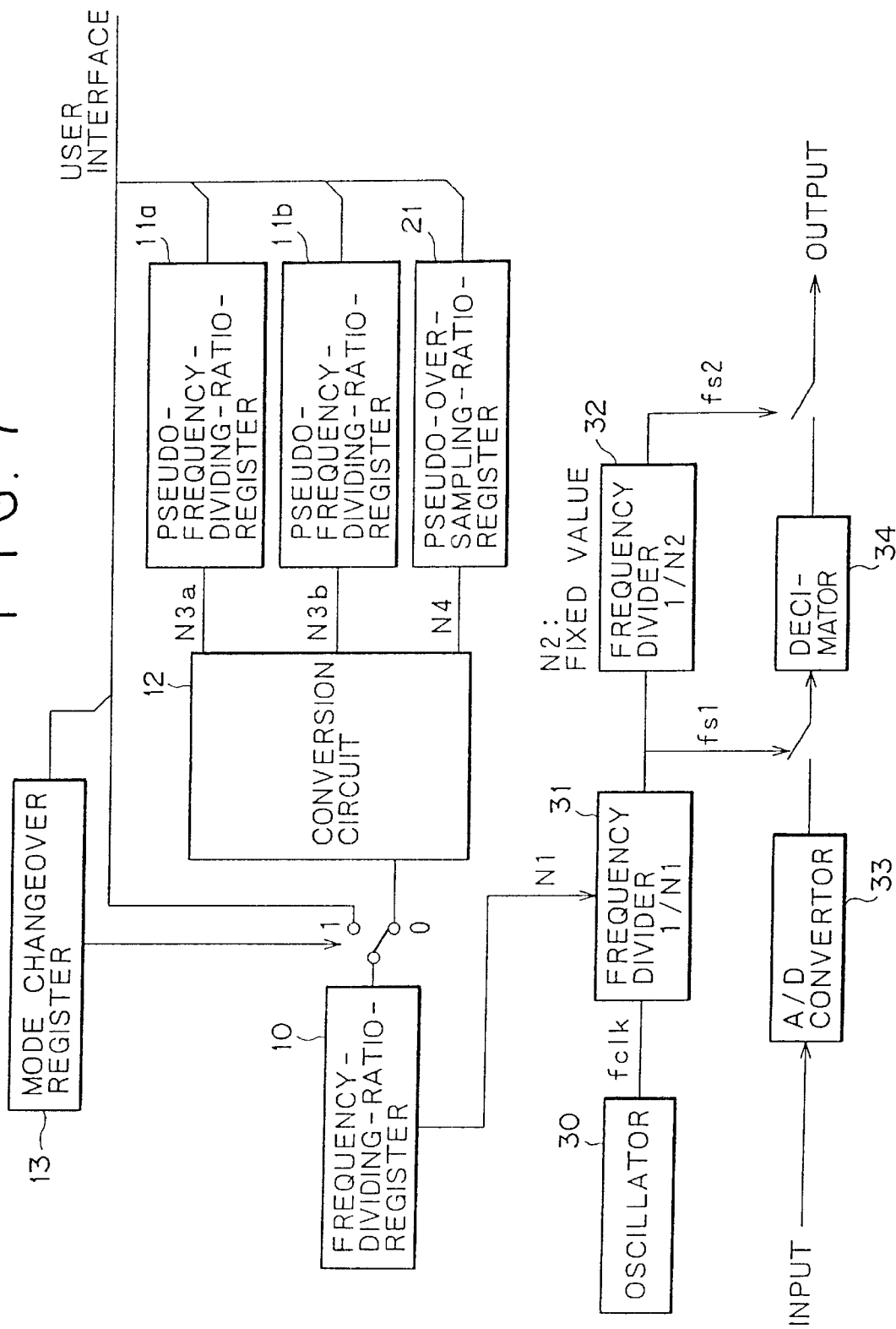
FIG. 7 shows a block diagram showing the configuration of the hardware to be operated with the software corresponding to a frequency divider having a two stage configuration.
Figure 15:
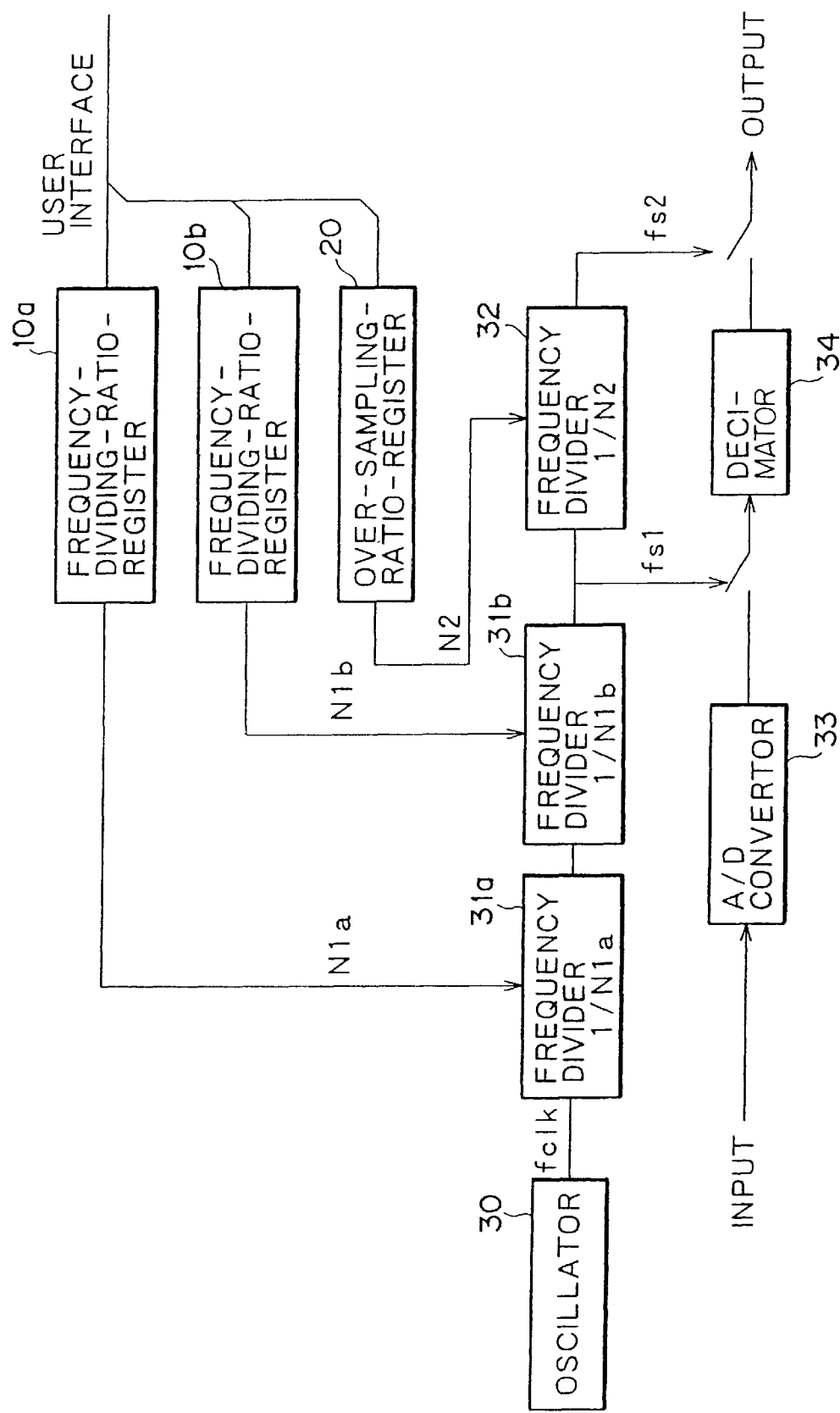
FIG. 15 shows a block diagram showing a conventional technique (frequency divider of a two stage configuration).
Figure 16:
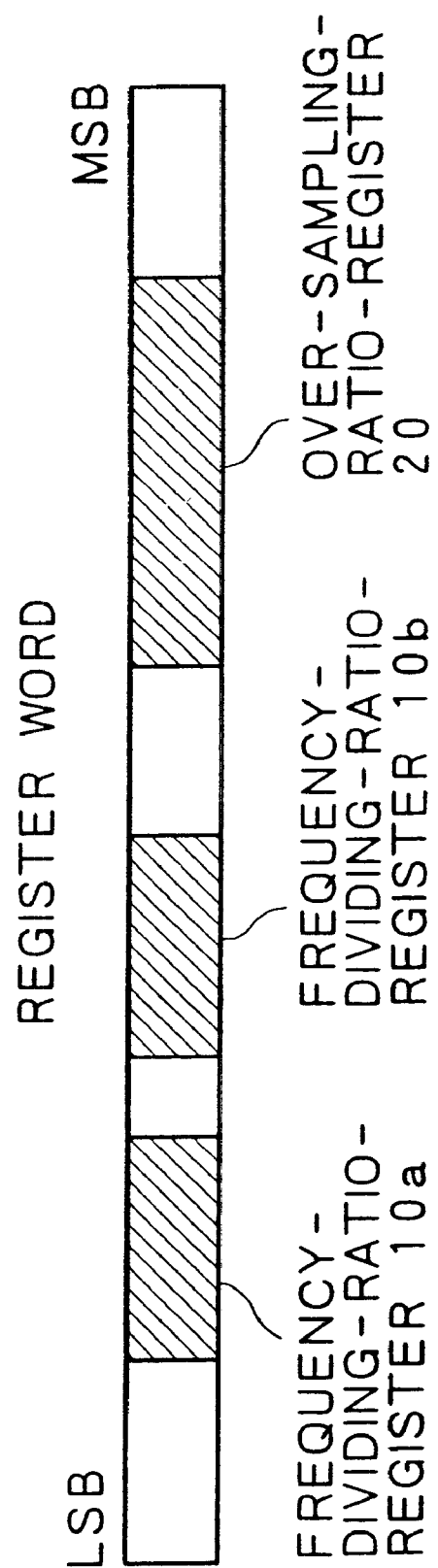
FIG. 16 shows the configuration of the register shown in FIG. 15.

FIG. 7 shows the second method in which over-sampling ratio is variable, wherein two stages of frequency dividers, 31a and 31b, as shown in FIG. 15 are provided and the hardware can be operated with the software corresponding to a method in which respective frequency dividing ratios, N1a and N1b of the above frequency dividers, 31a and 31b, are set in frequency-dividing-ratio-registers, 10a and 10b. In this method, as shown in FIG. 15, the frequency-dividing-ratio-registers, 10a and 10b, and the over-sampling-ratio-register 20 are allotted to the bits in a part of a register word.

In the present embodiment, in the similar manner to the embodiments shown in FIG. 3 and FIG. 5, the hardware can be operated with either kind of software in switching the set value of the changeover register 13. In the case where software corresponds to the first method in which the over-sampling ratio is fixed, the set value of the mode changeover register will be made 1 and the value input through the user interface is as it is written onto the frequency-dividing-ratio-register 10. In the case where software corresponds to the second method in which the over-sampling ratio is variable, the set value of the mode changeover register 13 will be made 0 and the values, N3a and N3b, written onto the pseudo-frequency-dividing-ratio-register and the value N4 written onto the pseudo-over-sampling-ratio-register 21 input through the user interface are converted to the frequency dividing ratio N1 by the conversion circuit 12, and it is written onto the frequency-dividing-ratio-register 10.

Figure 8:
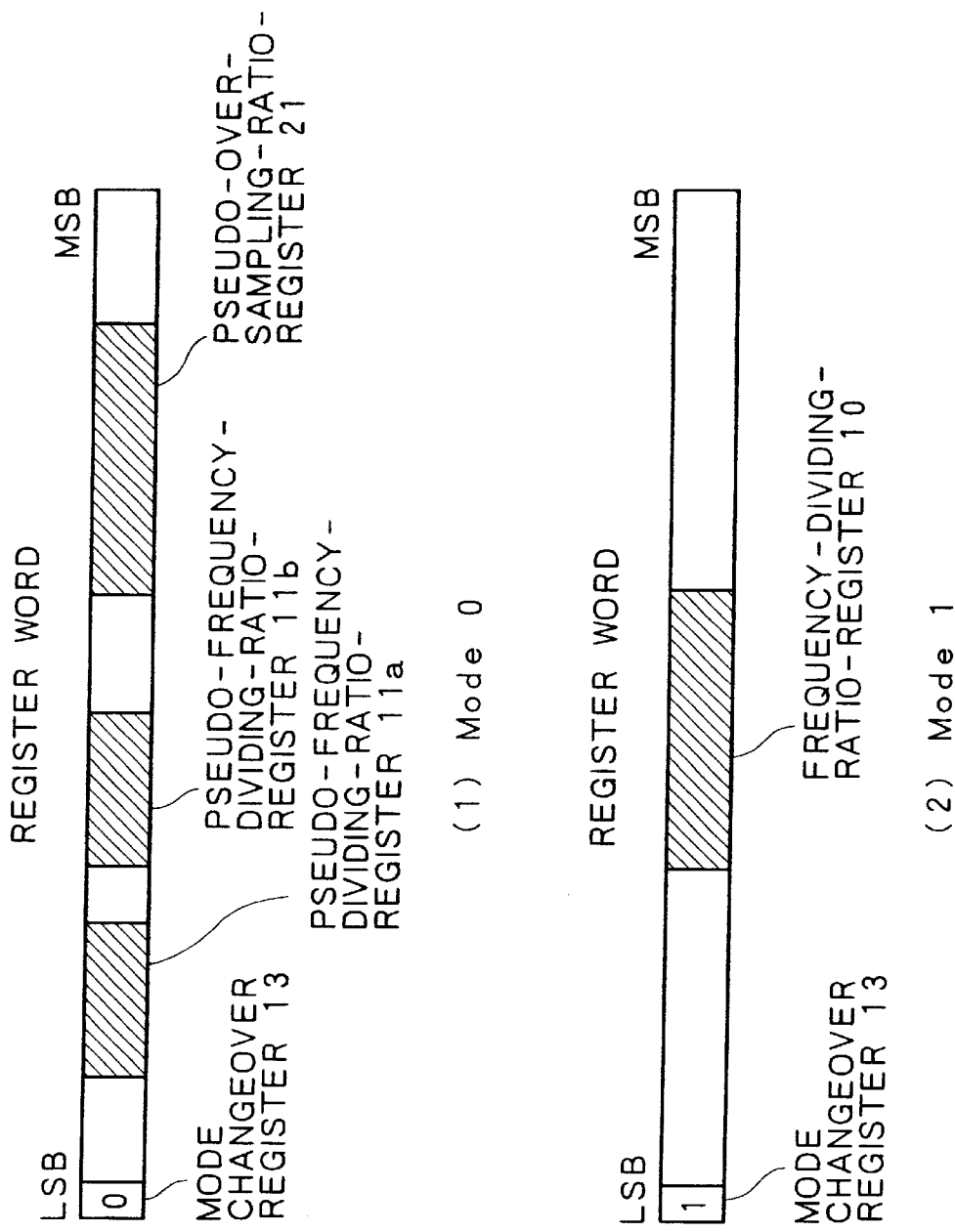
FIG. 8 shows the configuration of the register shown in FIG. 7.

FIG. 8 shows the configuration of a register in the embodiment shown in FIG. 7. The mode changeover register 13 is allotted to the LSB (Least Significant Bit); however, naturally, it can be allotted to any other bits. It might be better to decide the allotment of the mode changeover register 13 in consideration of the compatibility and the conformity with the conventional method. In most cases, in both first and second methods, a part of bits are reserved for the future development, and a part of the reserved bits will be used for the mode changeover register 13.

When the set value of the mode changeover register 13 is 0, that is, in the mode 0, as shown in FIG. 8(1), the pseudo-frequency-dividing-ratio-registers 11a and 11b, and the pseudo-over-sampling-ratio-register 21 are allotted to the bits in a part of a register word. In this mode, it is made possible to set the operation of the hardware according to the register writing format of the software corresponding to the second method in which the over-sampling ratio is variable.

When the set value of the mode changeover register 13 is 1, that is, in the mode 1, as shown in FIG. 8(2), only the frequency-dividing-ratio-register 10 is allotted in the bits in a part of a register word. In this mode, it is possible to set the operation of the hardware according to the register writing format of the software corresponding to the first method in which the over-sampling ratio is fixed.

In the above, an embodiment is described in which the hardware having a fixed over-sampling ratio can be operated with both kinds of software: one corresponding to the first method in which the over-sampling ratio is fixed and the other corresponding to the second method in which the over-sampling ratio is variable.

In contrast with this, it is also possible to operate the hardware in which over-sampling ratio is variable with both kinds of software: one corresponding to the first method in which the over-sampling ratio is fixed and the other corresponding to the second method in which the over-sampling ratio is variable.

Figure 9:
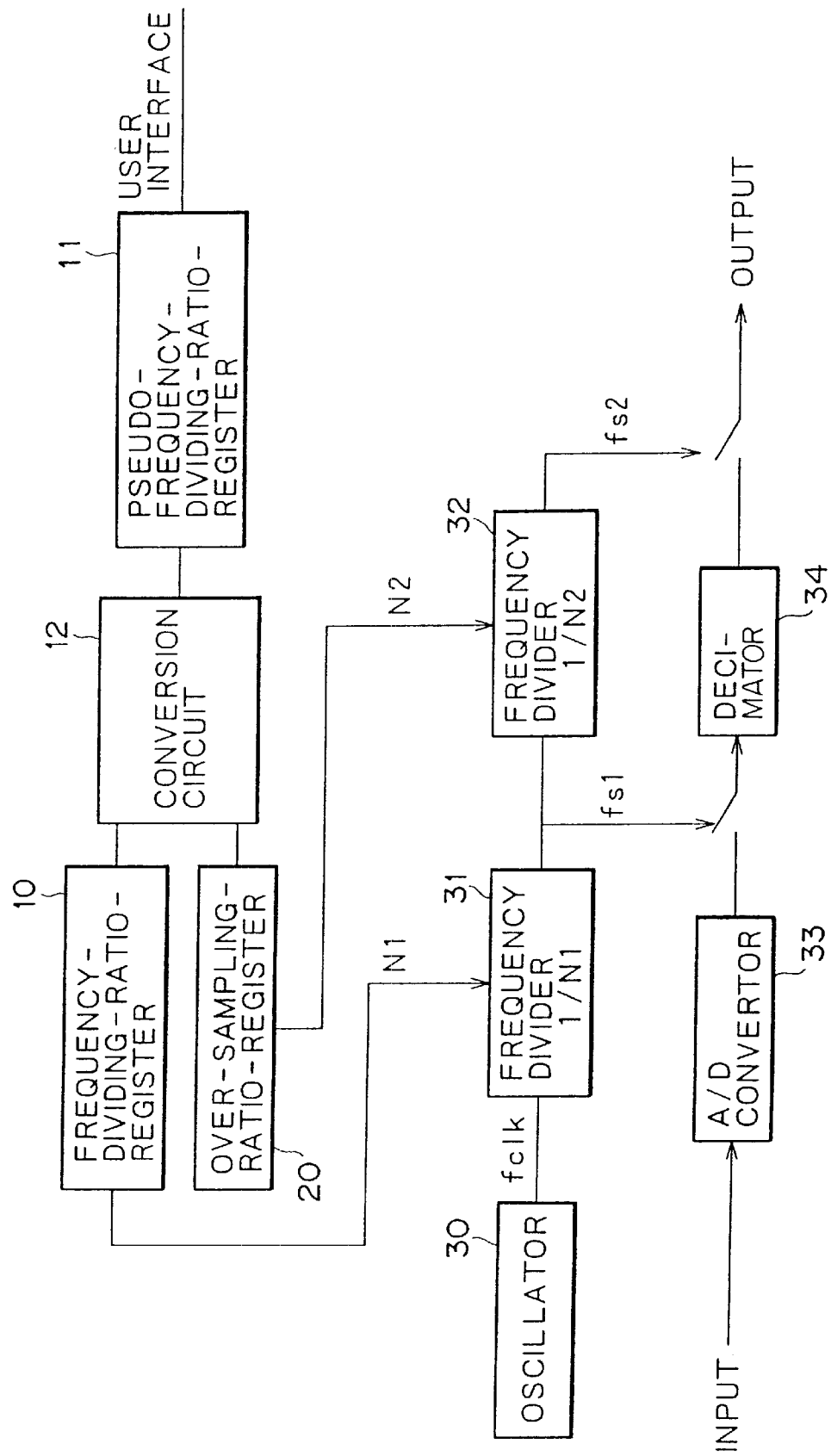
FIG. 9 shows a block diagram showing the hardware configuration in which the over-sampling ratio is variable.

FIG. 9 shows an embodiment for the hardware in which the over-sampling ratio is variable with the software corresponding to the first method in which over-sampling ratio is fixed. The value input through the user interface and written in the pseudo-frequency-dividing-ratio-register 11 us converted to the frequency dividing ratio N1 and the over-sampling ratio N2 by the conversion circuit 12 and the results are written in the frequency-dividing-ratio-register 10 and the over-sampling-ratio-register 20, respectively. The A/D conversion apparatus composed of the oscillator 30, frequency dividers 31 and 32, the A/D converter 33 and the decimator 34 is operated following the values of the frequency-dividing-ratio-register 10 and the over-sampling-ratio-register 20. As mentioned above, according to the present embodiment, it is possible to operate hardware in which the over-sampling ratio is variable with the software corresponding to the first method in which the over-sampling ratio is fixed. If the mode changeover register 13 is added as in the case of the embodiment shown in FIG. 3, it is possible to operate the hardware with both kinds of software by mode setting: one corresponding to the first method in which the over-sampling ratio is fixed and the other corresponding to the second method in which the over-sampling ratio is variable.

Figure 10:
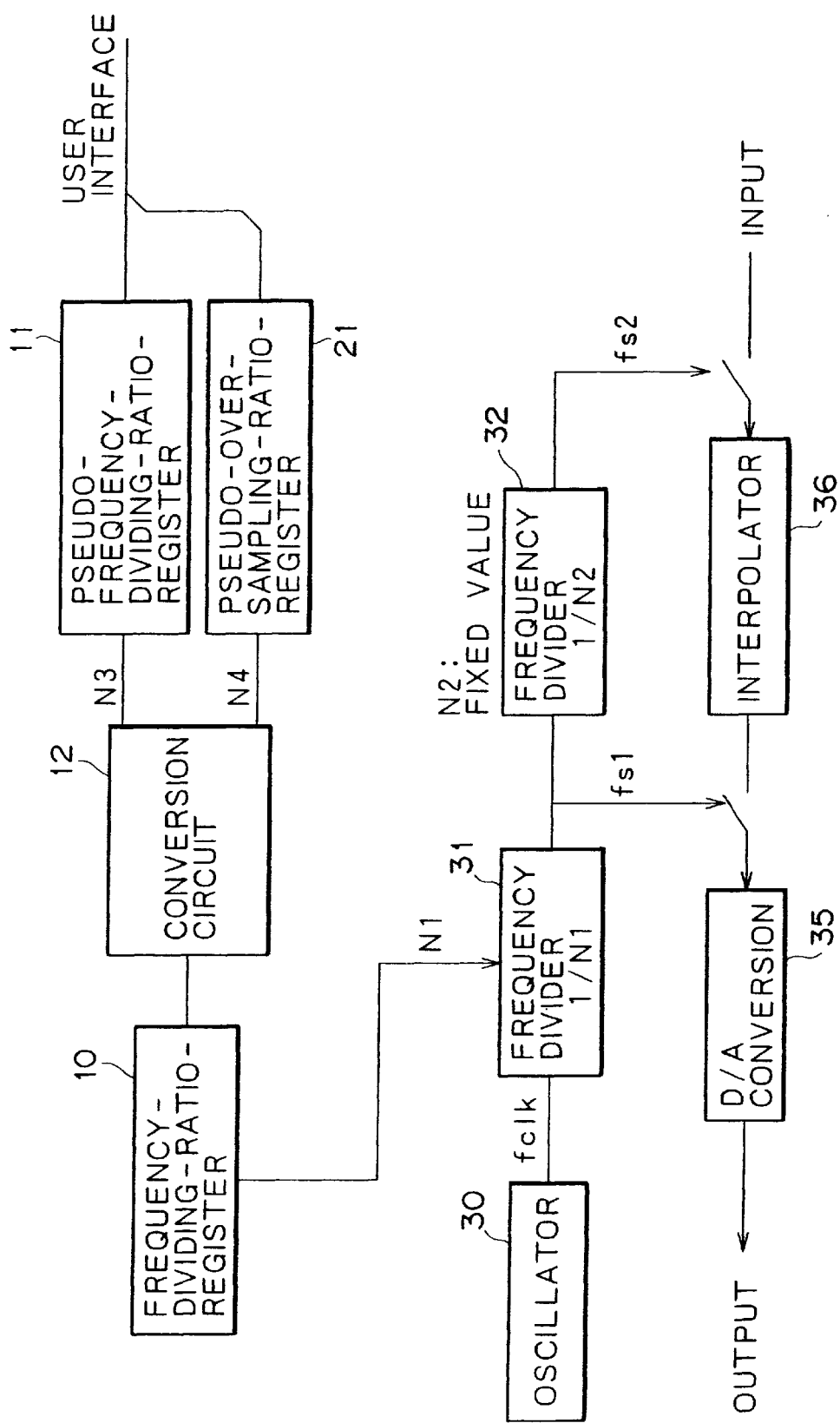
FIG. 10 shows a block diagram showing a D/A conversion apparatus.
Figure 11:
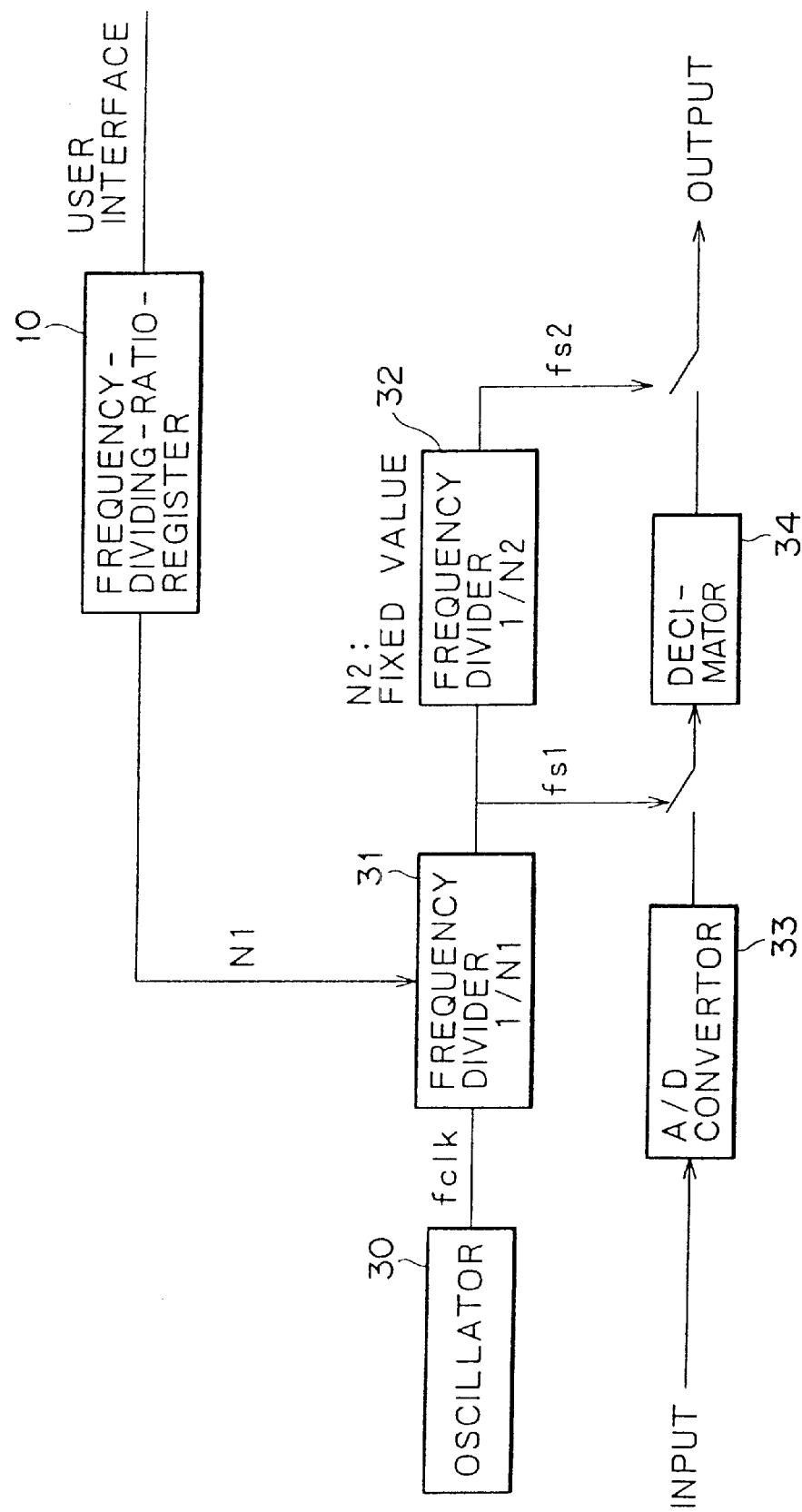
FIG. 11 shows a block diagram showing a conventional technique (fixed over-sampling ratio).
Figure 12:
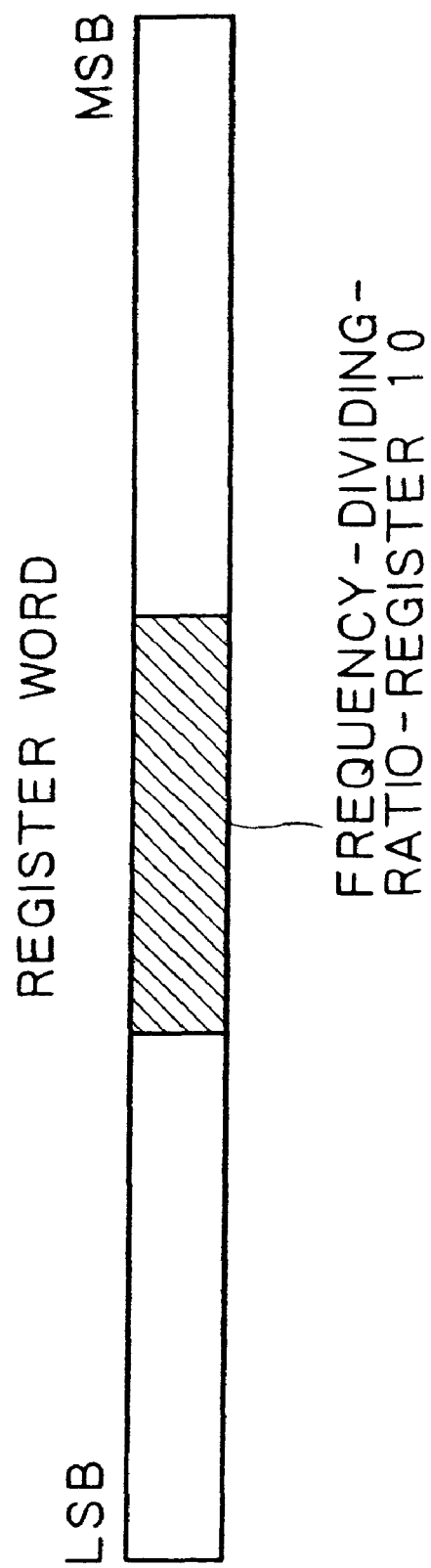
FIG. 12 shows the configuration of the register shown in FIG. 11.
Figure 13:
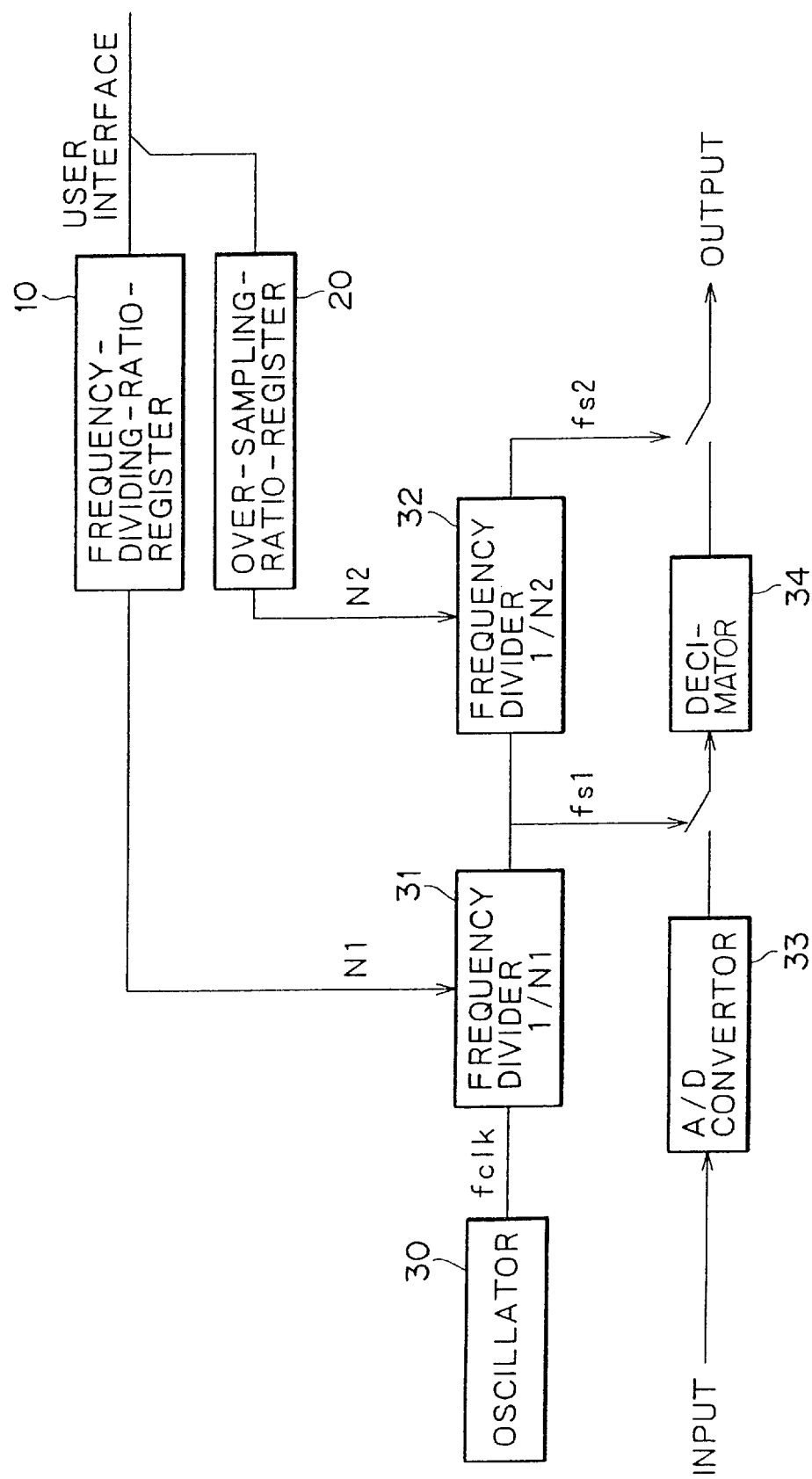
FIG. 13 shows a block diagram showing a conventional technique (variable over-sampling ratio).
Figure 14:
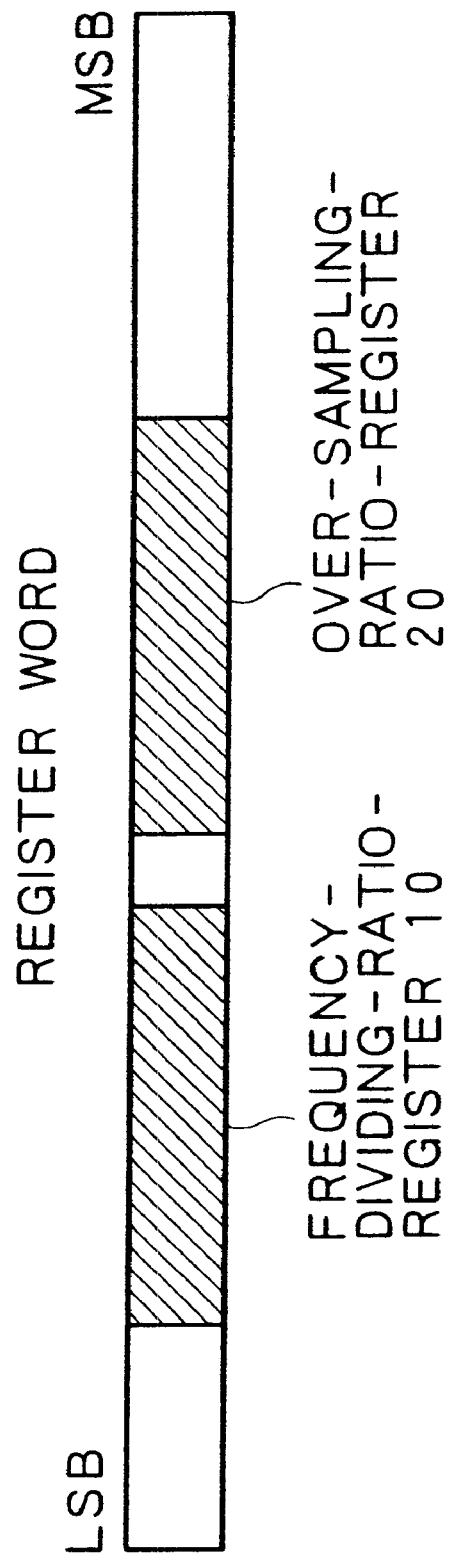
FIG. 14 shows the configuration of the register shown in FIG. 13.

In the above, the description about an A/D conversion apparatus is given; however the above-mentioned embodiment can be applied to an over-sampling D/A conversion, an inverse conversion to the above. FIG. 10 shows the block diagram of the embodiment.

The value N3 written onto the pseudo-frequency-dividing-ratio-register 11 and the value N4 written onto the pseudo-over-sampling-ratio-register 21 are converted to the frequency dividing ratio N1 by the conversion circuit 12 and written onto the frequency-dividing-ratio-register 10.

The original oscillation frequency fclk generated by the oscillator 30 is frequency-divided by the frequency divider 31 to 1/N1 and becomes the over-sampling frequency fs1. Further, it is frequency-divided by the frequency divider 21 to 1/N2 and becomes the sampling frequency fs2.

The interpolator 36 interpolates a signal of the sampling frequency fs2 time-wise and converts it to a signal of the over-sampling frequency fs1. In the case of interpolation, since an unnecessary frequency component called an image is generated, in many cases, the interpolator 36 is realized by the combination of comb filters and low-pass filters in a digital form.

In many cases, interpolation to multiply a frequency N2 times is not performed in a stage but over a plurality of stages. In such a case, the product of multiplication rates of respective stages becomes N2. The signal interpolated in the interpolator 36 in the last step, is converted to an analog signal by the D/A converter 35. In the following stage to the D/A converter 35, a post-filter (not shown in the drawing) is provided for eliminating the quantization noise generated in the case of D/A conversion.

When the mode changeover register 13 is added as described in the embodiment shown in FIG. 3, the hardware can be operated with either software by mode setting: one corresponding to the first method in which the over-sampling ratio is fixed and the other corresponding to the second method in which the over-sampling ratio is variable.

As mentioned above, according to the present invention, the hardware for the over-sampling A/D converter or D/A converter having a single unit constitution can be operated with either kind of software: one corresponding to the first method in which the over-sampling ratio is fixed and the other corresponding to the second method in which the over-sampling ratio is variable.

What is claimed is:

1. A conversion apparatus comprising:

an over-sampling-ratio-register and a frequency-dividing-ratio-register capable of being set by a signal from an external circuit, wherein a new frequency dividing ratio is generated based on the set values in said frequency-dividing-ratio-register and said over-sampling-ratio-register, and an original oscillation frequency is divided based on said generated frequency dividing ratio to form a sampling frequency.

2. A digital/analog conversion apparatus comprising:

an over-sampling-ratio-register and a frequency-dividing-ratio-register capable of being set by a signal from an external circuit, wherein a new frequency dividing ratio is generated based on the set values in said over-sampling-ratio-register and said frequency-dividing-ratio-register, and an original oscillation frequency is divided based on the generated frequency dividing ratio to form a sampling frequency.

3. A conversion apparatus comprising:

a pseudo-frequency-dividing-ratio-register;

a pseudo-over-sampling-ratio-register;

a frequency-dividing-ratio-register; and a conversion circuit for converting the values set in said pseudo-frequency-dividing-ratio-register and said pseudo-over-sampling-ratio-register to generate a set value of said frequency-dividing-ratio-register;

wherein an original oscillation frequency is divided based on the set value of said frequency-dividing-ratio register to form a sampling frequency.

4. A conversion apparatus according to claim 3, wherein in a case where a mode changeover signal input from an external circuit is in a first state, the value converted in said conversion circuit is made the set value of said frequency-dividing-ratio-register, and in a case where a mode changeover signal input from an external circuit is in a second state, the value input from the external circuit is made the set value of said frequency-dividing-ratio-register.

5. A conversion apparatus according to claim 3, wherein said apparatus further comprises a mode changeover register, and the value input from an external circuit is made the set value of said mode changeover register, in a case where the set value of said mode changeover register is in a first state, the value converted in said conversion circuit is made the set value of said frequency-dividing-ratio-register, and in a case where the set value of said mode changeover register is in a second state, the value input from an external circuit is made the set value of said frequency-dividing-ratio-register.

6. A conversion apparatus according to claim 5, wherein in a case where the set value of said mode changeover register is in a first state, said mode changeover register and said pseudo-frequency-dividing-ratio or said pseudo-over-sampling-ratio-register exist in the same register word, and in a case where the set value of said mode changeover register is in a second state, said mode changeover register and said frequency-dividing-ratio-register exist in the same register word.

7. An over-sampling digital/analog conversion apparatus comprising:

a pseudo-frequency-dividing-ratio-register;

a pseudo-over-sampling-ratio-register; and a frequency-dividing-ratio-register;

wherein the values set in said pseudo-frequency-dividing-ratio-register and said pseudo-over-sampling-ratio-register are converted to generate a set value of said frequency-dividing-ratio-register, and an original oscillation frequency is divided based on the set value of said frequency-dividing-ratio-resister to form a sampling frequency.

8. An over-sampling digital/analog conversion apparatus according to claim 7, wherein in a case where a mode changeover signal input from an external circuit is in a first state, the value converted in said conversion circuit is made the set value of said frequency-dividing-ratio-register, and in a case where a mode changeover signal input from the external circuit is in a second state, the value input from the external circuit is made the set value of said frequency-dividing-ratio-register.

9. An over-sampling digital/analog conversion apparatus according to claim 7, wherein said apparatus further comprises a mode changeover register and the value input from the external circuit is made the set value of said mode changeover register, in a case where the set value of said mode changeover register is in a first state, the value converted in said conversion circuit is made the set value of said frequency-dividing-ratio-register, and in a case where the set value of said mode changeover register is in a second state, the value input from the external circuit is made the set value of said frequency-dividing-ratio-register.

10. An over-sampling digital/analog conversion apparatus according to claim 9, wherein in a case where the set value of said mode changeover register is in a first state, said mode changeover register and said pseudo-frequency-dividing-ratio-register or said pseudo-over-sampling-ratio-register exist in the same register word, and in a case where the set value of said mode changeover register is in a second state, said mode changeover register and said frequency-dividing-ratio-register exist in the same register word.

11. A conversion apparatus comprising:

a pseudo-frequency-dividing-ratio-register;

an over-sampling-ratio-register; and a conversion circuit for converting set values of said frequency-dividing-ratio-register and said pseudo-frequency-dividing-ratio-register to generate set values of said frequency-dividing-ratio-register and said over-sampling-ratio-register;

wherein an original oscillation frequency is divided to form a sampling frequency, and a decimator is operated based on the set value of said over-sampling-ratio-register.

12. A conversion apparatus according to claim 11, wherein in a case where a mode changeover signal input from an external circuit is in a first state, the value converted in said conversion circuit is made the set value of said frequency-dividing-ratio-register and said over-sampling-ratio-register, and in a case where a mode changeover signal input from the external circuit is in a second state, the value input from the external circuit is made the set values of said frequency-dividing-ratio-register and said over-sampling-ratio-register.

13. A conversion apparatus according to claim 11, wherein said apparatus further comprises a mode changeover register and a value input from an external circuit is made the set value of said mode changeover register, in a case where the set value of said mode changeover register is in a first state, the value converted in said conversion circuit is made a set value of said frequency-dividing-ratio-register and said over-sampling-ratio-register, and in a case where the set value of said mode changeover register is in a second state, the value input from the external circuit is made a set value of said frequency-dividing-ratio-register and said over-sampling-ratio-register.

14. A conversion apparatus according to claim 13, wherein in a case where the set value of said mode changeover register is in a first state, said mode changeover register and said pseudo-frequency-ratio-register exist in the same register word, and in a case where the set value of said changeover register is in a second state, said mode changeover register and said frequency-dividing-ratio-register or said over-sampling-ration-register exist in the same register word.

15. An over-sampling digital/analog conversion apparatus comprising:

a pseudo-frequency-dividing-ratio-register;

an over-sampling-ratio-register; and a conversion circuit for converting set values of the frequency-dividing-ratio-register and the pseudo-frequency-dividing-ratio-register to generate set values of said frequency-dividing-ratio-register and said over-sampling-ratio-register;

wherein an original oscillation frequency is divided based on a set value of said frequency-dividing-ratio-register to form a sampling frequency, and an interpolator is operated based on the set values of said over-sampling-ratio-register.

16. An over-sampling digital/analog conversion apparatus according to claim 15, wherein in a case where a mode changeover signal input from an external circuit is in a first state, a value converted in said conversion circuit is made the set values of said frequency-dividing-ratio-register and said over-sampling-ratio-register, and in a case where a mode changeover signal input from a external circuit is in a second state, the value input from the external circuit is made the set value of said frequency-dividing-ratio-register and said over-sampling-ratio-register.

17. An over-sampling digital/analog conversion apparatus according to claim 15, wherein said apparatus further comprises a mode changeover register and the value input from an external circuit is made the set value of said mode changeover register, in a case where the set value of said mode changeover register is in a first state, a value converted in said conversion circuit is made the set values of said frequency-dividing-ratio-register and said over-sampling-ratio-register, and in a case where the set value of said mode changeover register is in a second state, a value input from the external circuit is made the set values of said frequency-dividing-ratio-register and said over-sampling-ratio-register.

18. An over-sampling digital/analog conversion apparatus according to claim 17, wherein in a case where the set value of said mode changeover register is in a first state, said mode changeover register and said pseudo-frequency-dividing-ratio-register exist in the same register word, and in a case where the set value of said mode changeover register is in a second state, said mode changeover register and said frequency-dividing-ratio-register or said over-sampling-ratio-register exist in the same register word.

19. A conversion apparatus according to claim 1, wherein said conversion apparatus is an analog/digital conversion apparatus.

20. A conversion apparatus according to claim 1, wherein said conversion apparatus is a digital/analog conversion apparatus.

21. A conversion apparatus according to claim 3, wherein said conversion apparatus is an over-sampling analog/digital conversion apparatus.

22. A conversion apparatus according to claim 11, wherein said conversion apparatus is an over-sampling analog/digital conversion apparatus.

* * * * *